United States Patent [19]

Carter

[11] Patent Number: 4,669,796

[45] Date of Patent: Jun. 2, 1987

[54] RAM CONNECTOR

[75] Inventor: Clyde T. Carter, Shermans Dale, Pa.

[73] Assignee: Wells Electronics, Inc., South Bend, Ind.

[21] Appl. No.: 800,985

[22] Filed: Nov. 22, 1985

[51] Int. Cl.$^4$ .............................................. H01R 9/09
[52] U.S. Cl. ..................................... 439/372; 439/71
[58] Field of Search ........... 339/75 M, 75 MP, 17 CF

[56] References Cited

U.S. PATENT DOCUMENTS

| | | | |
|---|---|---|---|
| 4,381,131 | 4/1983 | Demnianiuk | 339/75 M |
| 4,491,377 | 1/1985 | Pfaff | 339/75 M |
| 4,533,192 | 8/1985 | Kelley | 339/75 MP |
| 4,553,805 | 11/1985 | Aikens | 339/17 CF |
| 4,571,015 | 2/1986 | Mueller | 339/75 MP |

Primary Examiner—John McQuade
Attorney, Agent, or Firm—Thomas J. Dodd

[57] ABSTRACT

A connector for a leadless chip carrier. The connector includes a base which has opposed latches and a spring biased camming actuator which shifts the latches into a clamped position to secure the chip carrier within the base.

7 Claims, 6 Drawing Figures

RAM CONNECTOR

SUMMARY OF THE INVENTION

This invention relates to a connector for a leadless chip.

The connector of this invention is used with a leadless chip, commonly referred to as a random access memory (RAM) chip and serves to connect the chip to a circuit board in an electrical appliance, such as a computer or telephone. The connector includes free-floating latches which secure the chip in the connector base. An actuator member allows for movement of the latches to facilitate insertion and removal of the chip from the connector. The base includes a plurality of conductive contacts which provide the electrical connection between the chip and a power source.

Accordingly, it is an object of this invention to provide a novel connector which is made in such manner as to securely hold a leadless chip.

Another object of this invention is to provide for a leadless chip connector which is durable and efficient during automated loading and unloading.

Another object of this invention is to provide for a leadless chip connector which allows rapid insertion and removal of the chip.

Other objects of this invention will become apparent upon a reading of the following description.

BRIEF DESCRIPTION OF THE DRAWINGS

A preferred embodiment of the invention has been depicted for illustrative purposes wherein.

DESCRIPTION OF THE PREFERRED EMBODIMENT

Figure 1:
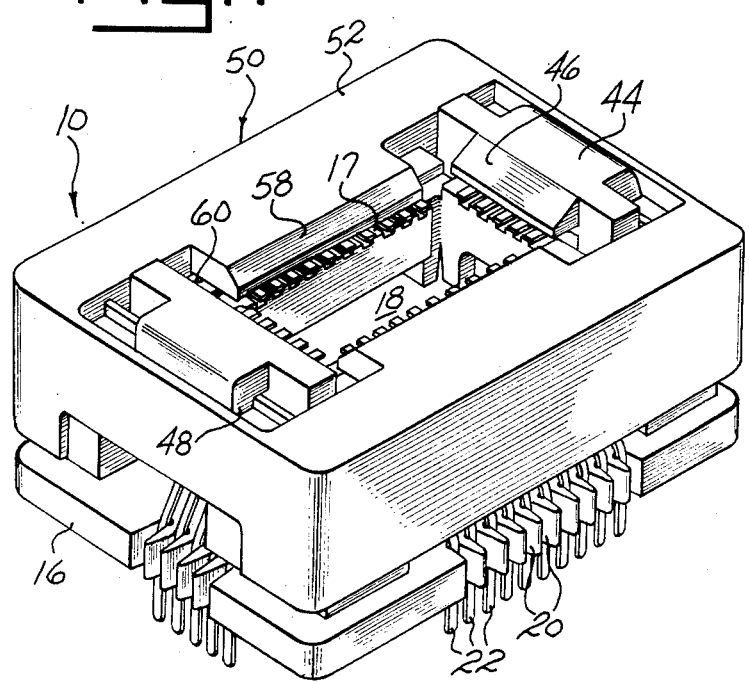
FIG. 1 is a perspective view of the connector with the latches in a clamped position.
Figure 2:
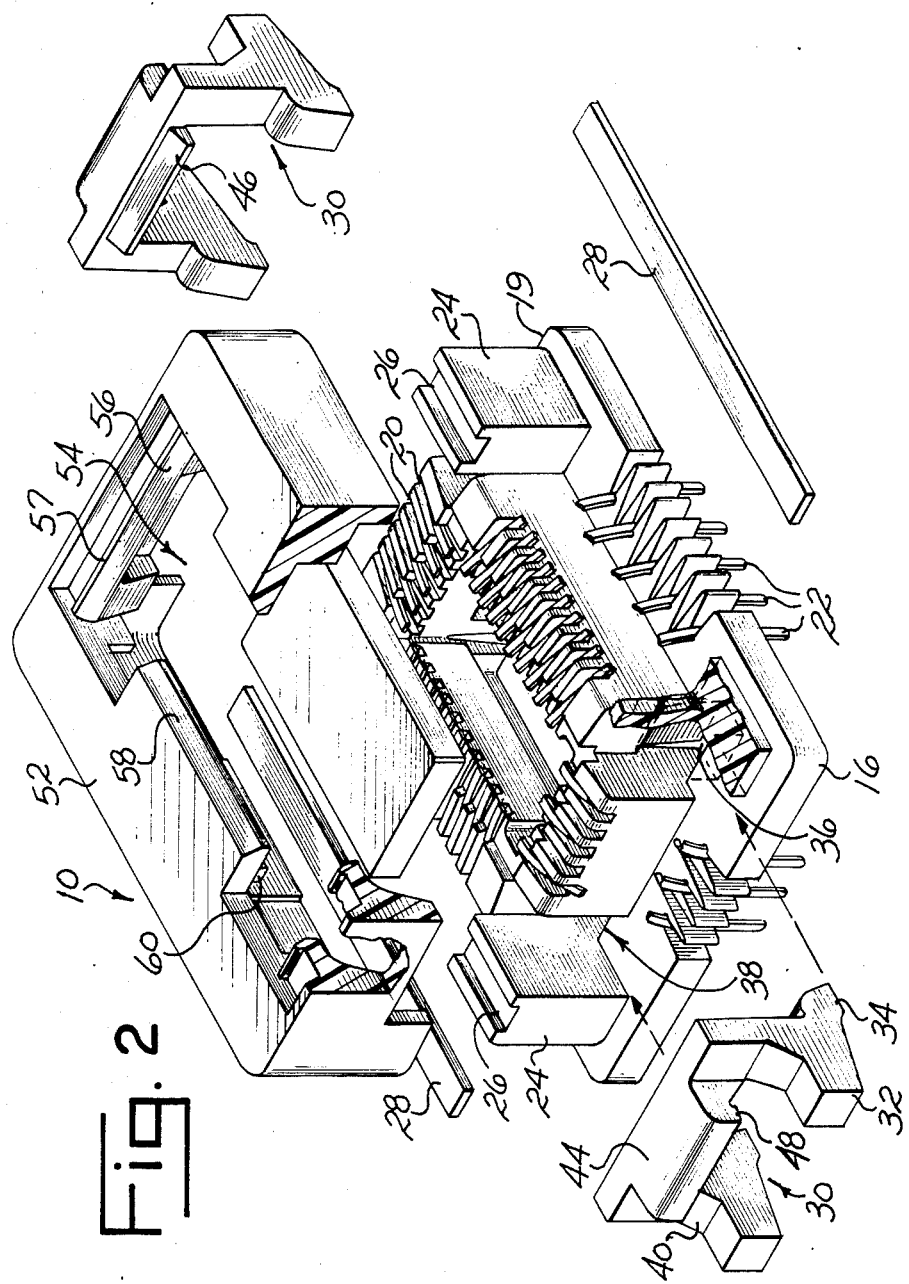
FIG. 2 is an exploded view of the connector.

The preferred embodiment herein described is not intended to be exhaustive or to limit the invention to the precise form disclosed. It is chosen and described to explain the principles of the invention and its application and practical use to enable others skilled in the art to utilize the invention.

The connector 10 shown in the drawings secures a leadless chip 12, which includes a plurality of conductive pads imprinted on a face of the chip. Connector 10 includes a base 16 which has a center opening 18. A peripheral shoulder 17 is located about center opening 18 and supports chip 12. Base 16 includes a plurality of spaced grooves 20, each of which locates a conductive contact 22 which extends partially into center opening 18 to provide electrical connection between chip 12 and a power source (not shown). Base 16 also includes corner posts 24 which include align channels 26. A flat spring 28 extends between corner posts 24 and rests in channels 26.

A pair of opposed latches 30 are freely fitted within slots 38 in base 16. Each latch 30 includes a foot part 32 which has a bevelled front edge 34 fitted into a lower opening 36 in base slots 38. A neck part 40 is integral with and extends upwardly of foot part 32. A head part is integral with neck part 40 and includes a top camming face 44, a front chip retainer part 46, and rear retainer part 48.

Figure 3:
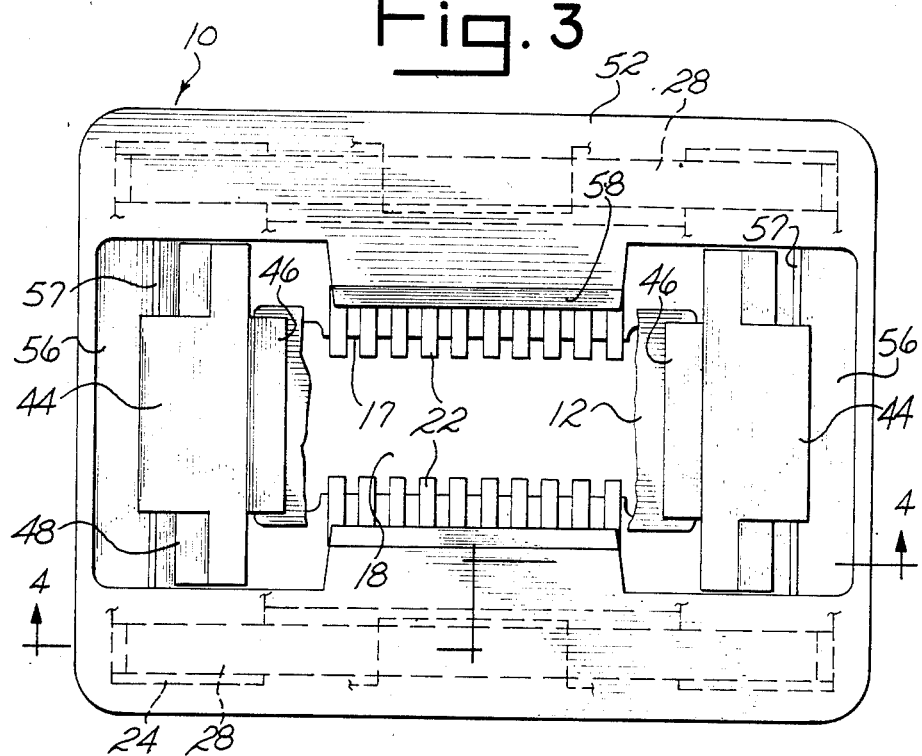
FIG. 3 is a top plan view of the connector.
Figure 4:
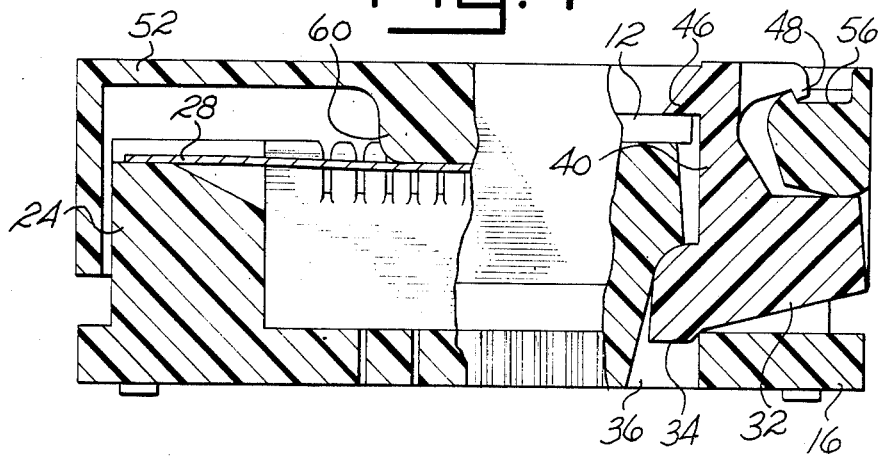
FIG. 4 is a sectional view taken along line 4—4 of FIG. 3, showing the latches in the clamped position.
Figure 5:
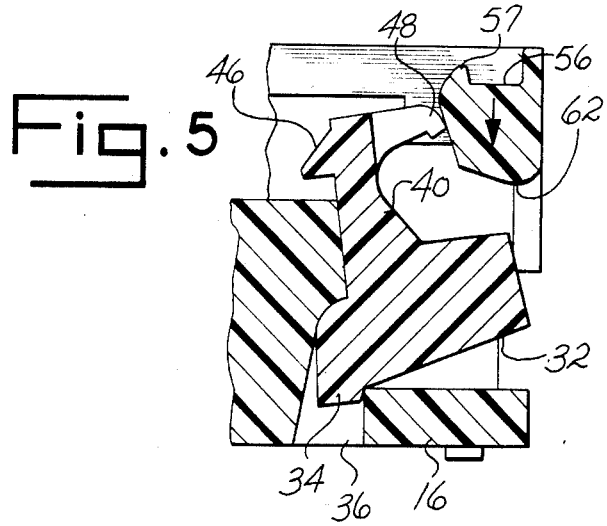
FIG. 5 is a fragmentary sectional view of the actuator and latch just prior to assembly.
Figure 6:
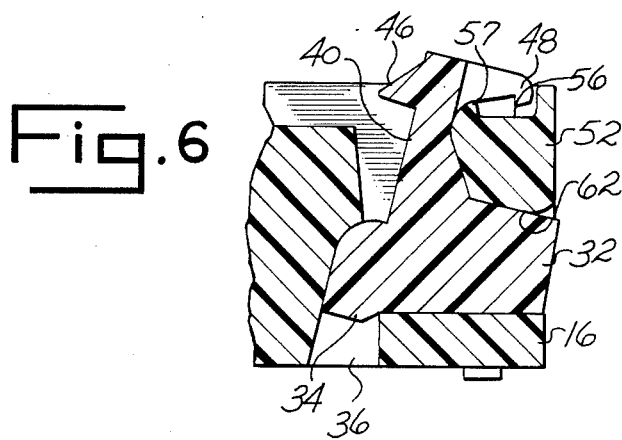
FIG. 6 is a fragmentary sectional view showing the latch being cammed into the open position.

Connector 10 also includes an actuator part 50. Actuator part 50 includes a frame 52 which has a central opening 54. Frame 52 includes opposed latch retainer or tab parts 56 as shown in FIGS. 1 and 3, and opposed bevelled projections 58. Actuator part 50 also includes an internal shoulder 60 as shown in FIG. 1 which contacts springs 28 and urges them downwardly. Accordingly, the springs exert a force which tends to separate base 16 and actuator part 50 and would do so absent the latches 30. With base 16, spring 28 and latches 30 assembled, connector 10 is assembled by pushing actuator 50 downwardly from its unconnected position of FIG. 5 in direction of the arrow shown over retainer part 48 until its leading edge 62 makes contact with the latch camming faces as shown in FIG. 6. This contact between the leading edge 62 of actuator 50 and foot part 32 of each latch 30 causes the latches to be cammed into an open position over base center opening 18. Actuator 50 is now in assembled form and connector 10 is ready for use. Connector 10 is operated to secure chip 12 as follows. Chip 12 is placed in actuator central opening 54, properly positioned laterally between opposed bevelled projections 58, and actuator 50 depressed into the position shown in FIG. 6. This movement of actuator 50 pivots or cams latches 30 into thier open position to receive chip 12. At the time that actuator 50 is pushed downwardly, internal shoulders 60 make contact and urge springs 28 into a tension producing position. When actuator 50 is released, springs 28 place an upward force or tension upon actuator 50 with actuator latch retainer part 56 making interlocking engagement with latch retainer parts 48 as shown in FIG. 4 to cause the latches to be pivoted inwardly until each latch retainer part 46 overlies chip 12 to secure the chip within base center opening 18 atop base shoulder 17 as shown in FIG. 4. When in this clamp or closed position, latch foot front edge 34 secures latch 30 to base 16 by a wedge fit within base openings 36 as also seen in FIG. 4.

It is understood that the invention is not limited to the scope of the above given details, but may be modified within the scope of the appended claims.

I claim:

1. A connector for a leadless chip, said connector comprising a base member, a plurality of conductive contacts anchored in said base member for engaging said chip, first and second latches pivotally carried by said base member, each latch including a retainer means for engaging said chip, each latch shiftable between a clamp position with said retainer means adjacently overlying and contacting said chip, and an open position with the retainer means spaced from said chip wherein the chip may be inserted into or removed from said base member, and a single overlying unitary actuator means contacting said latches for urging the latches into their said open position, said actuator means including means for retaining said latches in their said clamp position.

2. The connector of claim 1 wherein said actuator means includes spaced end walls and a center opening, each actuator end wall including a part extending towards said actuator center opening, each actuator end wall part constituting means for contacting a latch for urging said latch into its said open position for retaining the latch in its clamp position.

3. The connector of claim 1 wherein said base member includes a plurality of grooves, said contacts restrictively fitted within said grooves.

4. The connector of claim 1 wherein said base member includes biasing means for urging said actuator means upwardly into engagement with each latch when in its clamp position.

5. The connector of claim 4 wherein said base member includes corner posts having aligned slots, said biasing means is a flat spring fitted within said slots and extending between said corner posts, said actuator means including shoulder means for contacting said flat spring wherein said actuator means is urged upwardly into contact with said latches.

6. The connector of claim 2 wherein said base member includes a plurality of openings, each latch including a foot part fitted within a said base opening, said foot part constituting means for securing said latch to said base member in a wedge fashion when the latch is in the clamp position.

7. The connector of claim 2 wherein each actuator end wall part interlocks with a said latch in its said clamp position.

* * * * *